(12) United States Patent
BrightSky et al.

(10) Patent No.: US 8,673,717 B2
(45) Date of Patent: Mar. 18, 2014

(54) SELF-ALIGNED PROCESS TO FABRICATE A MEMORY CELL ARRAY WITH A SURROUNDING-GATE ACCESS TRANSISTOR

(75) Inventors: Matthew J. BrightSky, Pound Ridge, NY (US); Chung H. Lam, Peekskill, NY (US); Gen P. Lauer, Mahopac, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/551,776

(22) Filed: Jul. 18, 2012

(65) Prior Publication Data

US 2014/0024185 A1    Jan. 23, 2014

(51) Int. Cl.
*H01L 21/336* (2006.01)
(52) U.S. Cl.
USPC .... 438/258; 438/102; 257/316; 257/E21.666; 257/E21.068; 257/E45.001
(58) Field of Classification Search
USPC .............. 438/102, 266, 257, 258; 257/5, 314, 257/315, 316, E21.666, E21.068, E45.001
See application file for complete search history.

(56) References Cited

U.S. PATENT DOCUMENTS

| | | | |
|---|---|---|---|
| 7,397,060 B2 | 7/2008 | Lung | 257/2 |
| 7,525,141 B1 | 4/2009 | Forbes | 257/296 |
| 7,629,638 B2 * | 12/2009 | Yaegashi | 257/316 |
| 7,767,568 B2 | 8/2010 | An et al. | 438/588 |
| 7,785,923 B2 | 8/2010 | Chang et al. | 438/102 |
| 7,811,879 B2 | 10/2010 | Lam et al. | 438/234 |
| 2010/0314598 A1 | 12/2010 | Park | 257/2 |

* cited by examiner

*Primary Examiner* — David Vu
(74) *Attorney, Agent, or Firm* — Ido Tuchman; Vazken Alexanian

(57) ABSTRACT

A method to prevent a gate contact from electrically connecting to a source contact for a plurality of memory cells on a substrate. The method includes forming pillars with a doped silicon region on the substrate. An electrically conductive gate material is deposited between and over the pillars. The gate material is etched such that the gate material partially fills a space between the pillars. The pillars are then etched such that a pair of pillars from the pillars include an insulating material over the doped silicon region. A gate contact is deposited between the pair of pillars such that the gate contact electrically couples the gate material at a contact interface level, and the insulating material extends below the contact interface level.

11 Claims, 8 Drawing Sheets

SELF-ALIGNED PROCESS TO FABRICATE A MEMORY CELL ARRAY WITH A SURROUNDING-GATE ACCESS TRANSISTOR

BACKGROUND

This invention relates to arrays of memory cells. Modern manufacturing techniques make it possible to pack more memory cells on a given area of substrate. Newer types of memory, such as Phase Change Memory cells, need a large amount of current to operate. This in turn has given rise to transistors, such as vertical access transistors, that allow for a large amount of current to be delivered to a relatively small area.

The confluence of high current densities and memory cells packed into relatively small areas has resulted in configurations and methods of manufacture that can accommodate them. One development has been the use of a self-alignment fabrication technique that allows structure to be formed on the substrate without photo resist masking. This allows for a tighter packing of cells than otherwise possible using traditional lithography techniques. However, such tightly packed memory arrays are susceptible to unintentional electrical shorting between the common-source contact and the word-line contact, thus rendering the memory array nonfunctional.

BRIEF SUMMARY

Accordingly, one example of the present invention is a method to prevent a word-line contact from electrically connecting to a source contact for a plurality of memory cells on a substrate. The method includes formation of pillars on the substrate. The pillars include a doped silicon region. A depositing step deposits an electrically conductive gate material between and over the pillars. The gate material is then etched such that the gate material partially fills a space between the pillars and the gate material forms a word line for the memory cells. Another etching step etches the pillars such that a pair of pillars from the pillars includes an insulating material over the doped silicon region. A depositing step deposits a gate contact between the pair of pillars such that the gate contact electrically couples the gate material at a contact interface level and the insulating material extends below the contact interface level.

BRIEF DESCRIPTION OF THE DRAWINGS

The subject matter that is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

DETAILED DESCRIPTION

Figure 1:
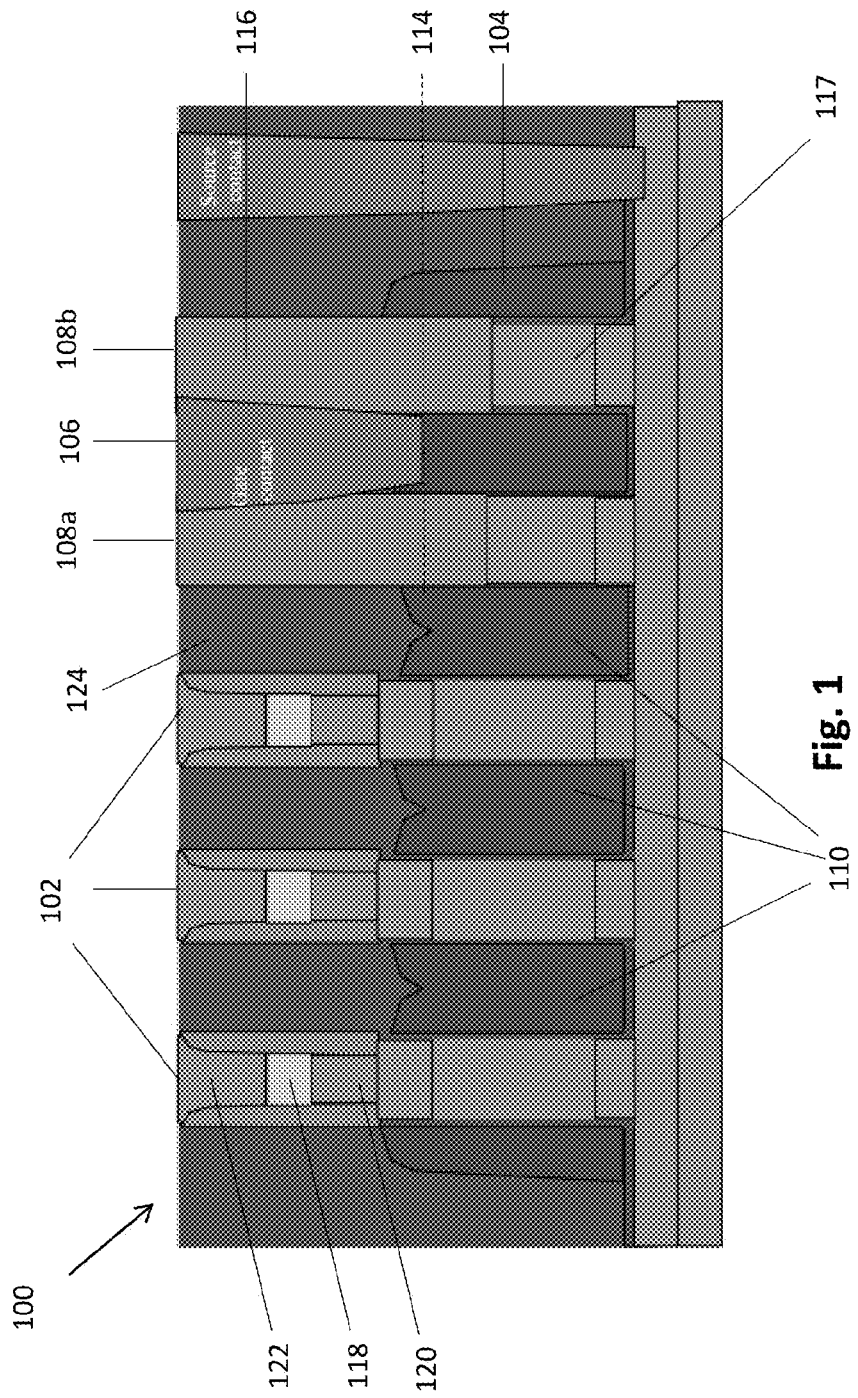
FIG. 1 shows a memory array in accordance with one embodiment of the present invention. The figure is a cutaway view along a word line, showing a plurality of memory cells, a word-line contact, a source contact and a pair of pillars comprised of an insulating material on each side of a gate contact.

The present invention is described with reference to embodiments of the invention. Throughout the description of the invention reference is made to FIGS. 1-5. When referring to the figures, like structures and elements shown throughout are indicated with like reference numerals.

FIG. 1 shows a memory array in accordance with one embodiment of the present invention. In this embodiment, a memory array 100 has a plurality of memory cells 102. The memory cells may include, for example, phase change material 118 between a bottom electrode 120 and a top electrode 122. In one embodiment, the bottom electrode 120 and the top electrode 122 are composed of titanium nitride (TiN). Each memory cell is laterally surrounded by an dielectric material 124, such as silicon oxide (SiO).

Each of the memory cells 102 is electrically coupled in parallel at its respective gate contract 106 to an electrically conductive gate material 110. A word line 104 is electrically coupled to the gate material 110 at a contact interface level 114. The memory array 100 includes a pair of pillars 108a and 108b. Each of the pillars contains an electrically insulating material 116 positioned over a doped silicon material 117. The first pillar 108a of the pair of pillars is disposed on a first side of the gate contact 106 and the second pillar 108b of the pair of pillars is disposed on a second side of the gate contact 106, such that the electrically insulating material 116 extends below the contact interface level 114. The electrically insulating material 116 may be, for example, silicon nitride. The doped silicon material 117 may be, for example, p-doped silicon.

Figure 2:
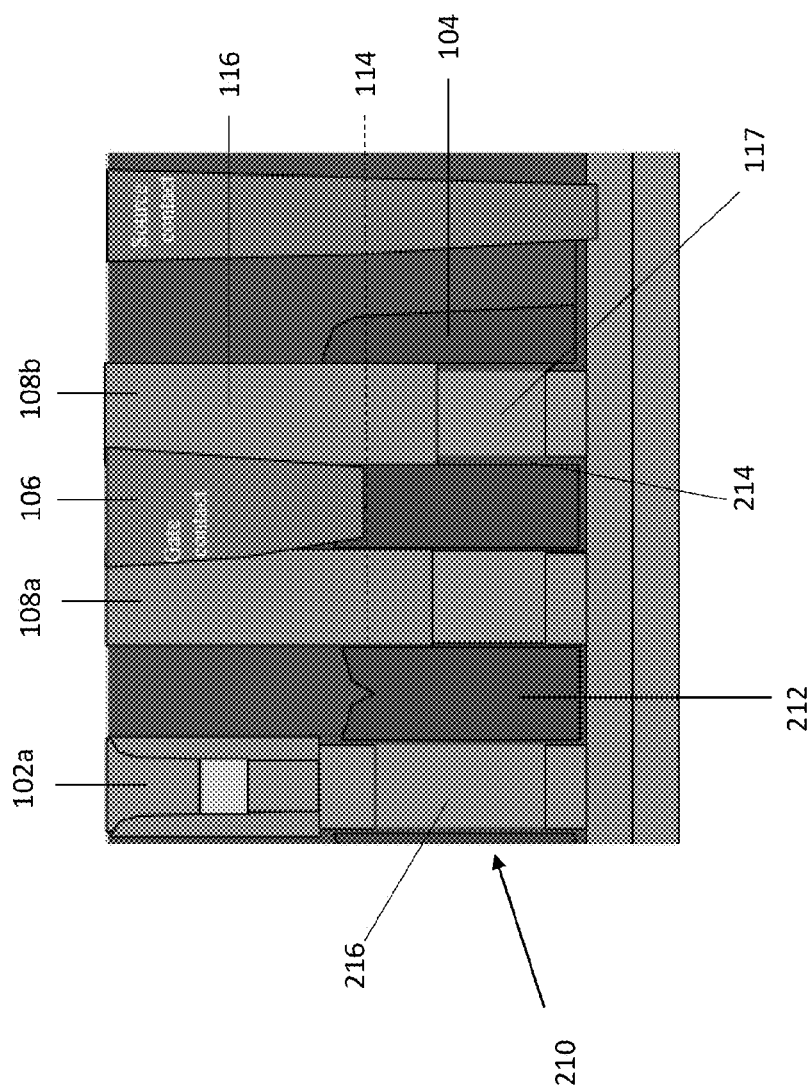
FIG. 2 is a magnified view of the pair of pillars around the gate contact and an electrical coupling between one of the plurality of memory cells to the word-line contact.

FIG. 2 is a closer view of the pair of pillars around the gate contact and the electrical coupling of a memory cell to the word-line contact in one embodiment of the present invention. A first pillar 108a of the pair of pillars 108a and 108b is disposed on a first side 106a of the word-line contact 106 and a second pillar 108b of the pair of pillars 108a and 108b is disposed on a second side 106b of the gate contact 106. The electrically insulating material 116 extends below the contact interface level 114.

Each of the pillars 108a and 108b includes a doped silicon 117 positioned below the electrically insulating material 116. The doped silicon 117 is the same material as the access transistor channel 216 of the vertical access transistors 210. Moreover, the doped silicon material 117 is surrounded laterally by a dielectric spacer 214. The dielectric spacer 214 is the same material as the gate oxide of the vertical access transistors 210. In one embodiment, the vertical access transistor is a n-p-n transistor.

Referring to FIGS. 1 and 2, a memory cell 102a of the plurality of memory cells 102 may include a vertical access transistor 210. Each vertical access transistor 210 includes a gate terminal 212 that is made of the electrically conducting gate material 110 (as shown in FIG. 1) and is electrically coupled to the word-line gate contact 106. In one embodiment of the invention, the memory cells 102 are phase change memory cells. The phase change memory cells may include $Ge_2Sb_2Te_5$. Alternatively, the phase change memory cells may include $Sb_xTe_{1-x}$ material, where $0.4 (Sb_2Te_3) <= x <= 0.7 (Sb_7Te_3)$. In another embodiment, the phase change memory cells may include $In_2Se_3$. The vertical access transistor may be a vertical surrounding-gate transistor with a channel diameter of one lithographic size feature.

Figure 3:
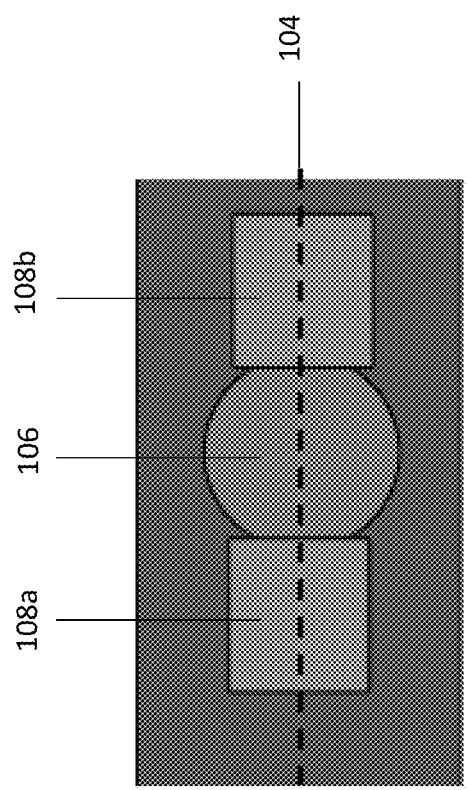
FIG. 3 is an elevation view of the gate contact and the surrounding pillars.

FIG. 3 is an elevation view of is an elevation view of the word line 104 centered on the neighborhood of the gate contact 106 and surrounding pillars 108a and 108b.

Figure 4:
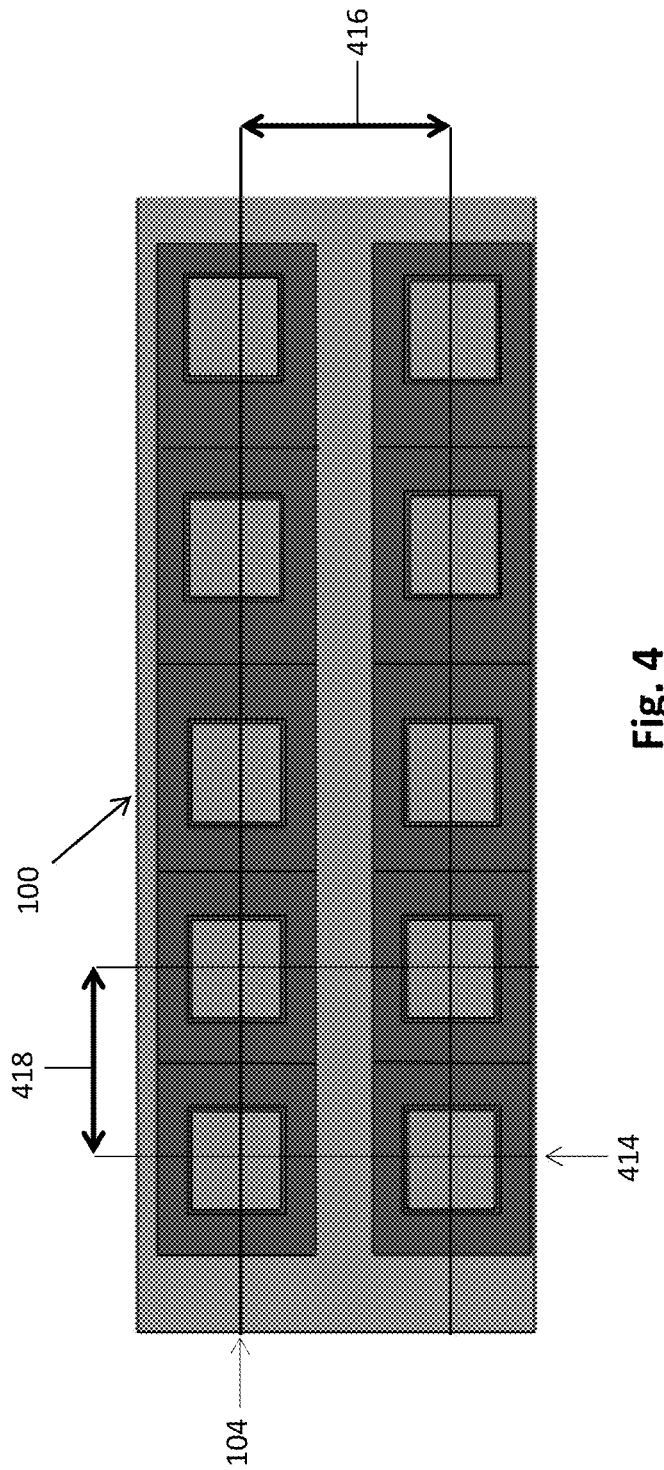
FIG. 4 is an elevation view of the memory array before the gate contact is deposited. This view illustrates relative linear dimensions of word and bit lines.

FIG. 4 is a schematic drawing of an elevation view of one embodiment of the present invention, showing the memory array 100 before the gate contact 106 (see FIG. 2) is deposited. The memory array 100 includes a plurality of bit lines 414. Referring to FIG. 1, each of the bit lines 414 is electrically coupled to one of the memory cells 102 along the word line 104. The bit lines 414 have a bit line pitch 418 and the word lines 104 have a word line pitch 416. The bit line pitch and word line pitch are designed in a way that the space between neighboring pillars in word line direction is smaller than that in bit line direction. Thus, the neighboring word lines are well separated. The bit line pitch 418 of the bit line 414 may be one lithographic feature size less than the word line pitch 416 of the word line 104. In another embodiment of the present invention, each of the bit lines 414 has a bit line pitch 418 of two lithographic feature sizes, and each word line 104 has a word line pitch 416 of three lithographic feature sizes.

Figure 5:
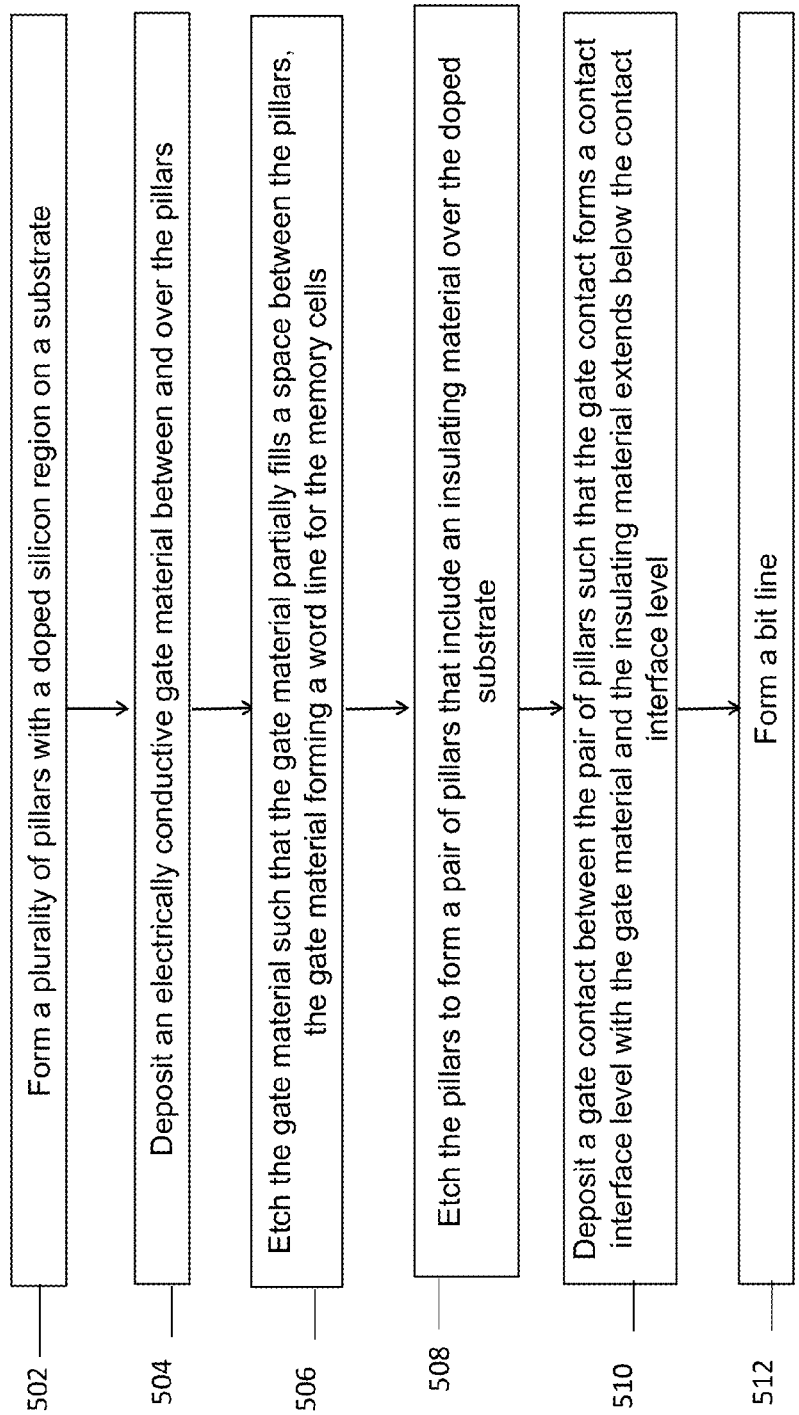
FIG. 5 shows a method to prevent a word-line contact from electrically connecting to a source contact for a plurality of memory cells on a substrate, in accordance with one embodiment of the present invention.

FIG. 5 shows a method to prevent a word-line contact from electrically connecting to a source contact for a plurality of memory cells on a substrate, in accordance with one embodiment of the present invention. The memory cells may be any types of memory cells that require access transistors. In one embodiment, the memory cells may be phase change memory cells. As discussed above, the phase change memory cells may include $Ge_2Sb_2Te_5$, a $Sb_xTe_{1-x}$ material, where $0.4 (Sb_2Te_3) <= x <= 0.7 (Sb_7Te_3)$, or $In_2Se_3$. The memory cells may be comprised of vertical access transistors. One embodiment of the method is a self-aligned integration scheme to build a high-density phase-memory cell with an area of 6 square lithographic feature sizes ($6F^2$) utilizing a vertical transistor as the access transistor. A channel for the vertical access transistor may be formed by silicon pillar etching, which is achieved by etching lines first and then etching lines orthogonal to them. The memory cell may be self-aligned to the drain of the access transistor.

The method includes a formation step 502. In the formation step 502, a plurality of pillars is formed on the substrate. The pillars include a doped silicon region, such as p-doped silicon. The dielectric pillars may be single crystal silicon pillars. Some of the single-crystal silicon pillars may be for building access transistors for the memory cells. After the formation step 502 is completed, the next step is a deposition step 504.

During the deposition step 504, an electrically conductive gate material is deposited between and over the pillars. The electrically conductive material is deposited to fill up the trenches on the substrate between the pillars. The electrically conductive gate material may be polysilicon. Deposition may be achieved by depositing a uniform layer of poly-silicon over the substrate followed by Chemical Mechanical Polishing. Other conducting gate material may replace the polysilicon material. After the deposition step 504 is completed, the next step is an etching step 506.

During the etching step 506, the gate material is etched such that the gate material partially fills a space between the pair of pillar and the gate material forms a word line for the memory cells. After the etching step 506 is completed, the next step is an etching step 508.

During the etching step 508, the pillars are etched such that a pair of pillars include an insulating material over the doped silicon region. The electrically insulating material may be silicon nitride. In one embodiment of the invention, the pillars are formed by etching a void into each pillar of a pair of dielectric pillars, followed by filling each of the voids with the insulating material. In another embodiment of the invention, the pair of pillars are formed by masking an area of the substrate above the pair of pillars before etching the gate material and removing the masking above the pair of pillars before depositing the gate contact. After the etching step 508 is completed, the next step is a deposition step 510.

During the deposition step 510, a gate contact is deposited between the pair of pillars such that the gate contact is in electrical contact with the gate material at a contact interface level. Further, the insulating material extends below the contact interface level. After the deposition step 510 is completed, the next step is a formation step 512.

During the formation step 512, a bit line is formed. In one embodiment of the present invention, a bit line pitch is at least one lithographic feature size less than the word line pitch of the word line. In another embodiment of the present invention, the word line has a pitch of 3 lithographic feature sizes and the bit line is formed with a pitch of 2 lithographic feature sizes.

Figure 6:
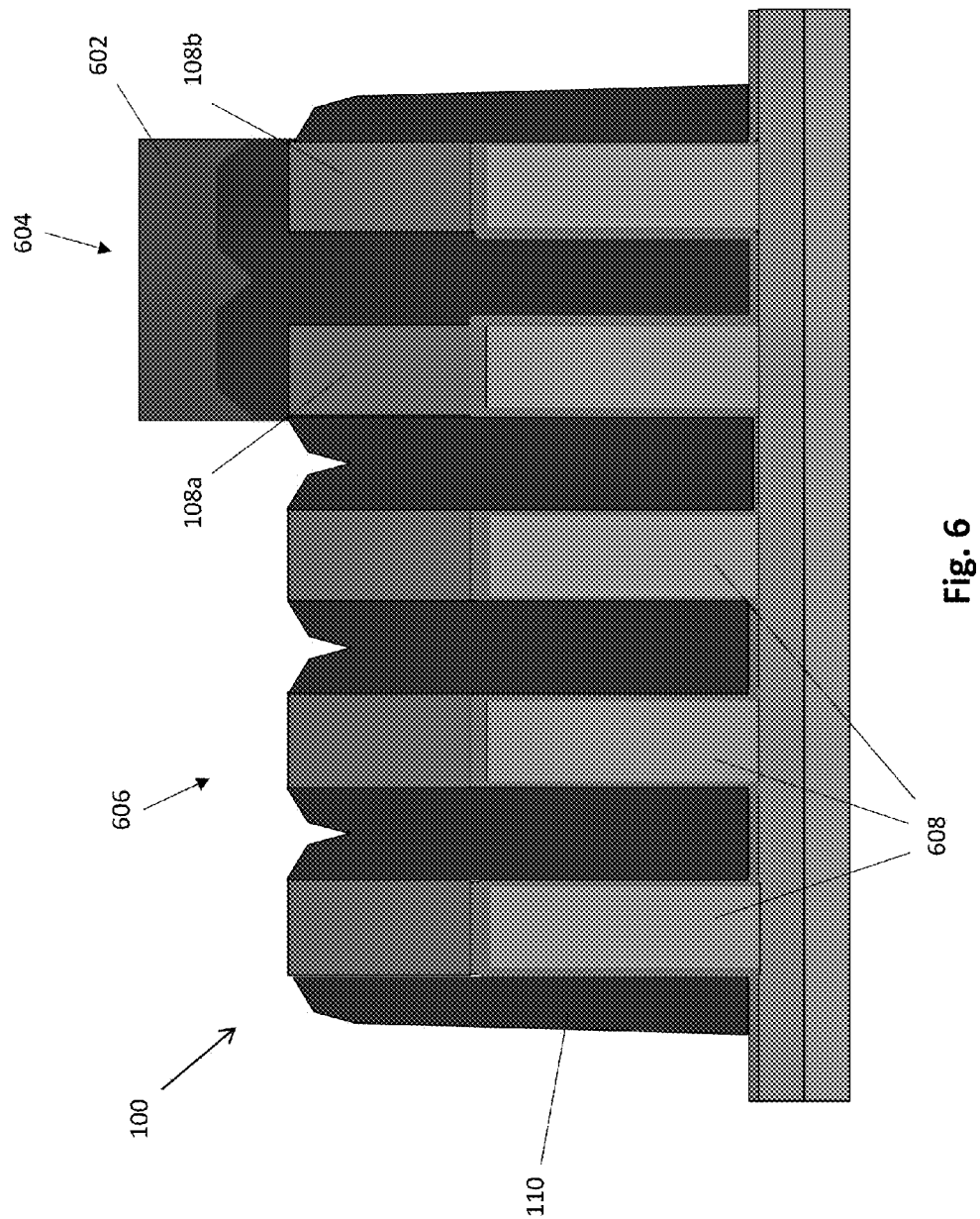
FIG. 6 shows an intermediary step for fabricating a memory array in accordance with one embodiment of the present invention.

Turning now to FIG. 6, an intermediary step for fabricating another embodiment of the memory array 100 is shown. In this embodiment, the gate material 110 is partially etched until neighboring word lines are disconnected (see FIG. 4). Next, a lithographic mask 602 is applied above the pair of pillars 108a and 108b after the gate material 110 is partially etched. Thus, the lithographic mask 602 defines a masked region 604 and an unmasked region 606. Next, the gate material 110 is continued to be etched until the top of the gate material 110 in the unmasked region 606 is etched below the top of the pillars 608 in the unmasked region 606.

Figure 7:
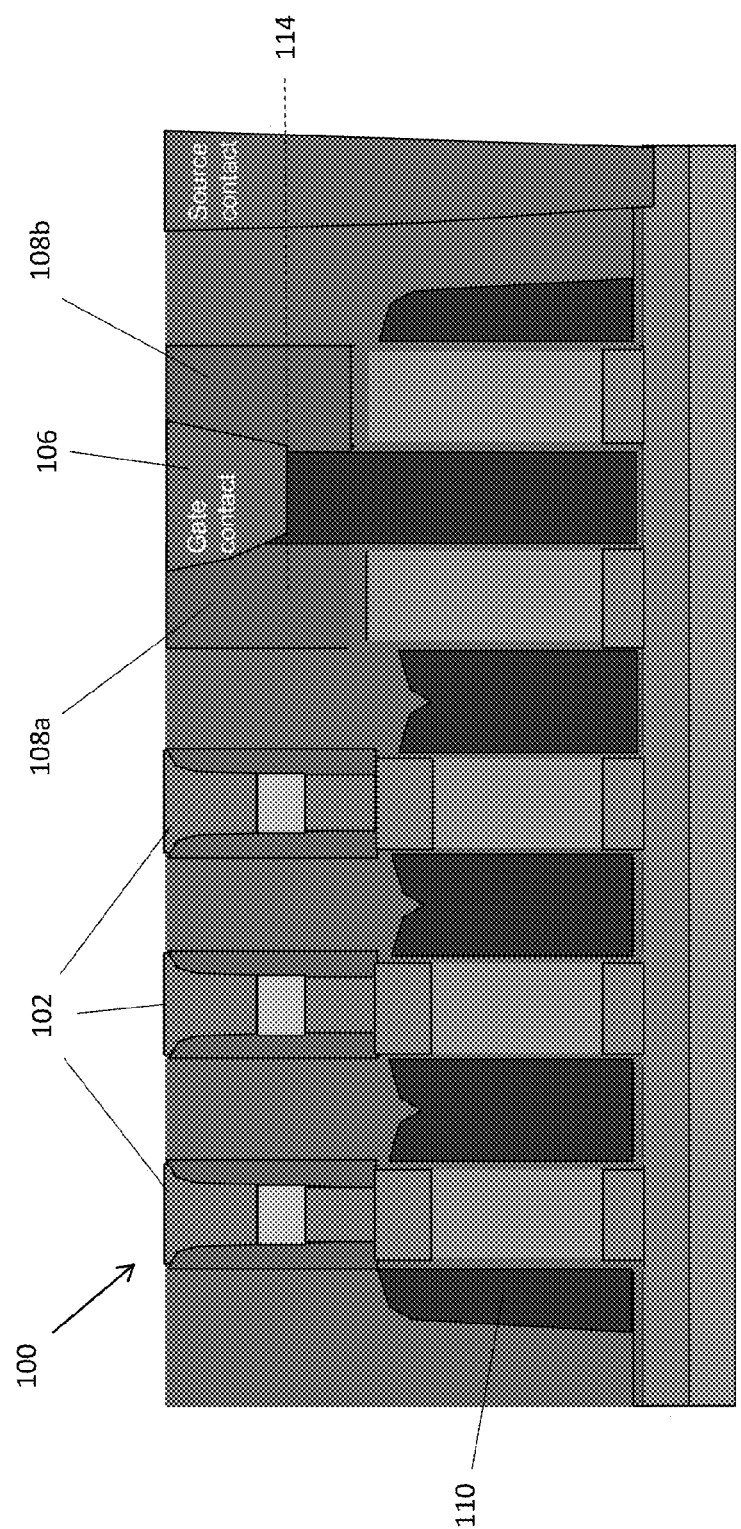
FIG. 7 shows a memory array in accordance with one embodiment of the present invention.

In FIG. 7, the memory array 100 is shown with the lithographic mask removed after the gate material 110 is etched. In addition, a gate contact 106 is deposited between the pair of pillars 108a and 108b such that the gate contact electrically couples the gate material. As shown, the gate material 110 below the gate contact 106 extends higher than the gate material 110 below the memory cells 102. Thus, the contact level 114 is higher than the gate material 110 below the memory cells 102.

Figure 8:
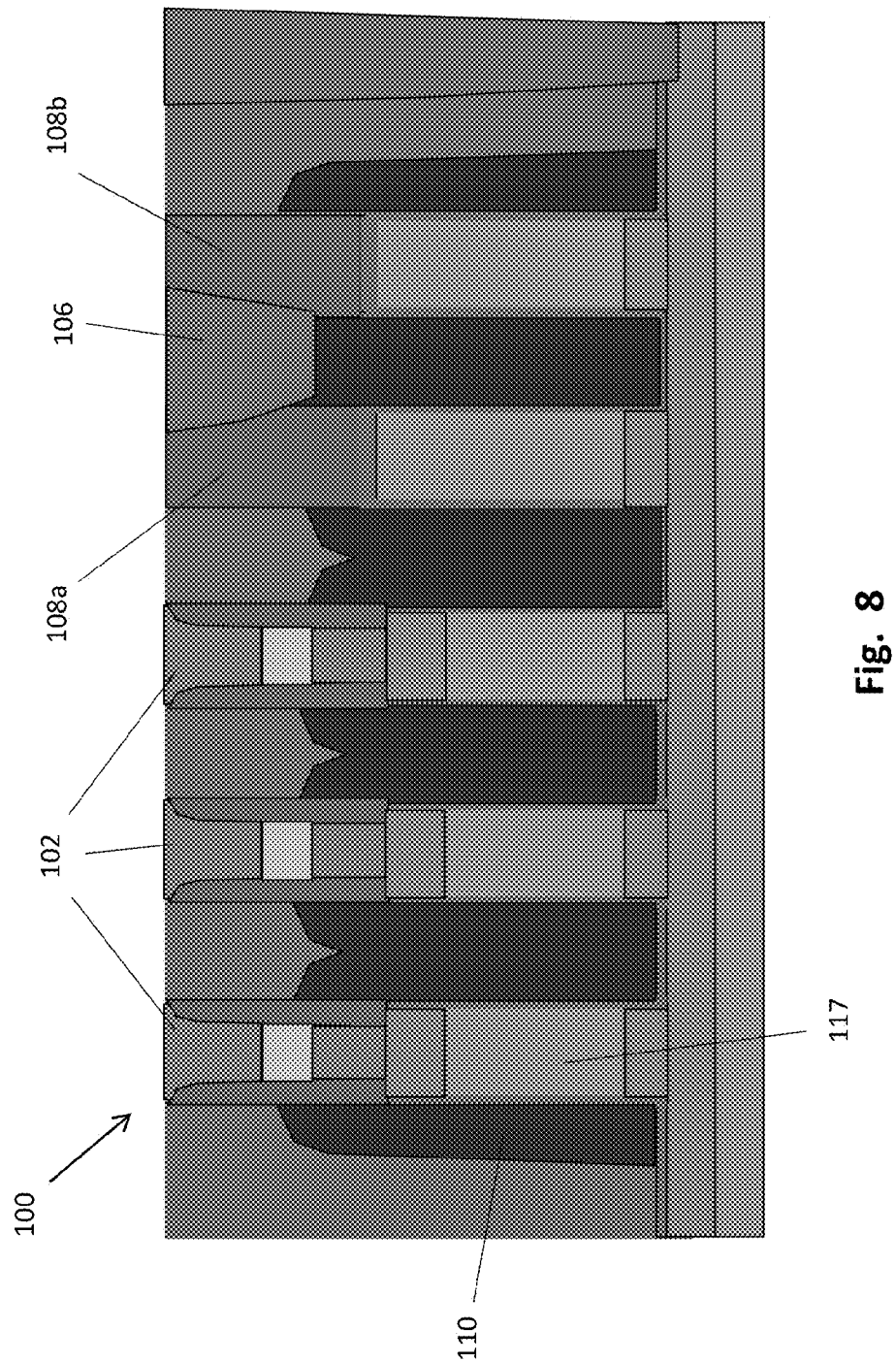
FIG. 8 shows a memory array in accordance with another embodiment of the present invention.

FIG. 8 illustrates another embodiment of the memory array 100. The fabrication process for this embodiment requires etching the gate material 110 partially until neighboring word lines are disconnected. Furthermore, the top of the gate material 110 maintained above the doped doped silicon region 117. After the gate material 110 is etched, the gate contact 106 is added between the its neighboring pillars 108a and 108b as discussed above.

Another embodiment of the present invention is a memory array includes a plurality of memory cells, each of the memory cells electrically coupled in parallel at its respective gate contract to an electrically conductive gate material; a word line electrically coupled to the gate material at a contact interface level; and a pair of pillars, each of the pair of pillars including an electrically insulating material over a doped silicon material, wherein a first pillar of the pair of pillars is disposed on a first side of the gate contact and a second pillar of the pair of pillars is disposed on a second side of the gate contact such that the electrically insulating material extends below the contact interface level.

The memory array may include a substrate electrically coupled to the doped silicon material. The memory array may include a dielectric spacer laterally surrounding the doped silicon material. Each of the plurality of memory cells may include a vertical access transistor, the vertical access transistor includes a gate terminal electrically coupled to the gate contact. The dielectric spacer may be the same material as a gate oxide of the vertical access transistor. The doped silicon material may be the same material as a transistor channel of the vertical access transistor. The insulating material may be silicon nitride. The plurality of memory cells may be phase change memory cells.

The memory array may include a plurality of bit lines. Each of the bit lines is electrically coupled to one of the memory cells. Further, the bit lines have a pitch of a least one lithographic feature size less than the word line. The bit lines may have a pitch of two lithographic feature sizes, and the word line have a pitch of three lithographic feature sizes.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method to prevent a gate contact from electrically connecting to a source contact for a plurality of memory cells on a substrate, the method comprising:
    forming a plurality of pillars on the substrate, the plurality of pillars including a doped silicon region;
    depositing an electrically conductive gate material between and over the pillars;
    etching the gate material such that the gate material partially fills a space between the pillars, the gate material forming a word line for the memory cells;
    etching the plurality of pillars such that a pair of pillars from the plurality of pillars include an insulating material over the doped silicon region; and
    depositing a gate contact between the pair of pillars such that the gate contact electrically couples the gate material at a contact interface level, and wherein the insulating material extends below the contact interface level.

2. A method as in claim 1, wherein the substrate is electrically coupled to the doped silicon region.

3. A method as in claim 1, wherein the plurality of pillars include a dielectric spacer laterally surrounding the doped silicon region.

4. A method as in claim 1, wherein the memory cells are phase change memory cells.

5. A method as in claim 1, wherein the insulating material is silicon nitride.

6. A method as in claim 1, wherein the memory cells include vertical access transistors, the vertical access transistors include a gate terminal electrically coupled to the gate contact.

7. A method as in claim 1, further comprising forming a bit line with a pitch at least one lithographic feature size less than the word line pitch.

8. A method as in claim 7, further comprising:
    forming a bit line with a pitch of two lithographic feature sizes; and
    forming the word line with a pitch of three lithographic feature sizes.

9. A method as in claim 1, further comprising:
    etching a void into each pillar of the pair of dielectric pillars; and
    filling each of the voids with an insulating material.

10. A method as in claim 1, further comprising:
    partially etching the gate material until neighboring word lines are disconnected;
    masking an area above the pair of pillars after partially etching the gate material to define a masked region and an unmasked region;
    continuing etching the gate material until the top of the gate material in the unmasked region is below the top of the plurality of pillars; and
    removing the masking above the pair of pillars before depositing the gate contact.

11. A method as in claim 1, further comprising:
    etching the gate material partially until neighboring word lines are disconnected and the top of the gate material is above the top of the doped silicon region.

* * * * *